(12) United States Patent
Zuehlsdorff et al.

(10) Patent No.: US 9,013,184 B2
(45) Date of Patent: Apr. 21, 2015

(54) MR IMAGING SYSTEM FOR AUTOMATICALLY PROVIDING INCIDENTAL FINDINGS

(75) Inventors: Sven Zuehlsdorff, Chicago, IL (US); Christopher Glielmi, Chicago, IL (US); Xiaoming Bi, Aurora, IL (US); Saurabh Shah, Chicago, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 617 days.

(21) Appl. No.: 13/358,533

(22) Filed: Jan. 26, 2012

(65) Prior Publication Data
US 2013/0021030 A1  Jan. 24, 2013

Related U.S. Application Data

(60) Provisional application No. 61/508,740, filed on Jul. 18, 2011.

(51) Int. Cl.
  *G01V 3/00* (2006.01)
  *G01R 33/48* (2006.01)
  *G01R 33/54* (2006.01)

(52) U.S. Cl.
  CPC .............. *G01R 33/48* (2013.01); *G01R 33/543* (2013.01)

(58) Field of Classification Search
  CPC .................................................... G01R 33/543
  USPC ................. 324/309, 307, 306; 600/410, 420
  See application file for complete search history.

(56) References Cited

U.S. PATENT DOCUMENTS

| | | | |
|---|---|---|---|
| 4,734,646 A * | 3/1988 | Shenoy et al. | 324/309 |
| 5,786,693 A * | 7/1998 | Gullapalli et al. | 324/309 |
| 6,301,497 B1 * | 10/2001 | Neustadter | 600/410 |
| 6,855,114 B2 | 2/2005 | Drukker et al. | |
| 7,283,862 B1 * | 10/2007 | Slavin et al. | 600/420 |
| 7,672,497 B2 | 3/2010 | Nicponski | |
| 2003/0007598 A1 | 1/2003 | Wang et al. | |
| 2003/0125621 A1 | 7/2003 | Drukker et al. | |
| 2003/0161513 A1 | 8/2003 | Drukker et al. | |
| 2006/0239544 A1 | 10/2006 | Yankelevitz et al. | |
| 2010/0223067 A1 | 9/2010 | Giles et al. | |
| 2011/0236304 A1 | 9/2011 | Goldenberg et al. | |

OTHER PUBLICATIONS

Randomly selected typical 30min cardiac MRI study at Northwestern University Chicago, USA Analysis of scanner activity attached Jun. 10, 2011.

(Continued)

*Primary Examiner* — Louis Arana
(74) *Attorney, Agent, or Firm* — Peter R. Withstandley

(57) ABSTRACT

A system automatically concurrently performs an MR image study acquisition and supplementary image data acquisition. The system includes a detector for providing a signal indicating individual portions of an imaging scan using a first imaging method have ceased. An image data processor automatically concurrently interleaves imaging of a first anatomical portion using the first imaging method and supplementary imaging of a second anatomical portion using a different second imaging method, in response to the signal. The image data processor incorporates identifier data in data representing images acquired using the second imaging method identifying images acquired using the second imaging method differently from images acquired using the first imaging method.

21 Claims, 6 Drawing Sheets

(56) References Cited

OTHER PUBLICATIONS

Siemens AG, "syngo LungCARE CT and syngo Lung CAD, Computer-aided detection and follow-up support of pulmonary nodules", Jul. 2009.

Faisal Khosa, Benjamin P Romney, Daniel N Costa, Neil M Rofsky, Warren J Manning, "Prevalance of Noncardiac Findings on Clinical Cardiovascular MRI", American Journal of Roentgenology, 196, W380-W386, Apr. 2011.

* cited by examiner

MR IMAGING SYSTEM FOR AUTOMATICALLY PROVIDING INCIDENTAL FINDINGS

This is a non-provisional application of provisional application Ser. No. 61/508,740 filed 18 Jul. 2011, by S. Zuehlsdorff et al.

FIELD OF THE INVENTION

This invention concerns a system for automatically concurrently interleaving imaging of a first anatomical portion in an MR image study using a first imaging method and supplementary imaging of a second anatomical portion using a different second imaging method upon detection the first imaging method has ceased.

BACKGROUND OF THE INVENTION

In clinical magnetic resonance imaging (MRI), the number of incidental findings is remarkably high. An incidental finding is the detection of unrelated and previously unknown pathology within the scope of a specific imaging study. Typically, incidental findings are found due to the cross sectional multi-dimensional nature of MR images. For instance, a recently published study (Khosa F, Romney B P, Costa D N, Rofsky N M, Manning W J, "Prevalence of Noncardiac Findings on Clinical Cardiovascular MRI", AJR 196: W380-W386 (2011)) retrospectively determined the prevalence and significance of non-cardiac findings (43%) on clinical cardiovascular MRI. The number of worrisome findings is relatively low (4.7% of non-cardiac findings). However, overlooking unsuspected pathology in images may have substantial impact on the health and disease management of the patient and may have legal consequences for a reading physician. The same study noted that most (99%) of the non-cardiac findings have been identified by using one of two standard sequences that are commonly used in cardiovascular MRI, namely a steady state free precession (SSFP) sequence and a T1 weighted spin echo sequence.

A typical cardiac examination consists of the acquisition of multiple images of the heart in different orientations using dedicated sequences that generate desired image contrast. Respiratory motion degrades image quality of cardiac MR images and is therefore often eliminated by instructing the patient to hold his breath during data acquisition. As a result, the scanner is idle while the patient recovers from a previous scan, or breath hold instructions are issued for the subsequent scan. Other causes of idle-time between scans include preparation of subsequent imaging protocols or use of equipment such as contrast agent injectors. FIG. 1 shows the scanner activity of a typical cardiac MRI study. A scanner is typically acquiring MRI data during about 15% of an entire study time (as determined using DICOM image data header information of resulting images). In non-cardiac studies the amount of idle time may be lower. A system according to invention principles addresses this inefficiency and related problems.

SUMMARY OF THE INVENTION

An MR system uses idle time of a patient scan to automatically acquire additional diagnostic images that are used to automatically and systematically identify incidental findings. A system automatically concurrently performs an MR image study acquisition and supplementary image data acquisition. The system includes a detector for providing a signal indicating individual portions of an imaging scan using a first imaging method have ceased. An image data processor automatically concurrently interleaves imaging of a first anatomical portion using the first imaging method and supplementary imaging of a second anatomical portion using a different second imaging method, in response to the signal. The image data processor incorporates identifier data in data representing images acquired using the second imaging method identifying images acquired using the second imaging method differently from images acquired using the first imaging method.

DETAILED DESCRIPTION OF THE INVENTION

An MR system uses idle time of a patient scan to automatically acquire additional diagnostic images that are used to automatically and systematically identify incidental findings. An incidental finding as used herein comprises a detected unrelated and unexpected and previously unknown pathology within the scope of a specific imaging study. A system according to invention principles uses the substantial idle time occurring within an MRI imaging study to acquire additional MRI images (add-on (supplementary) images) to a clinically indicated acquisition of MR images (study images) that can be used to identify incidental or unsuspected findings.

Figure 1:
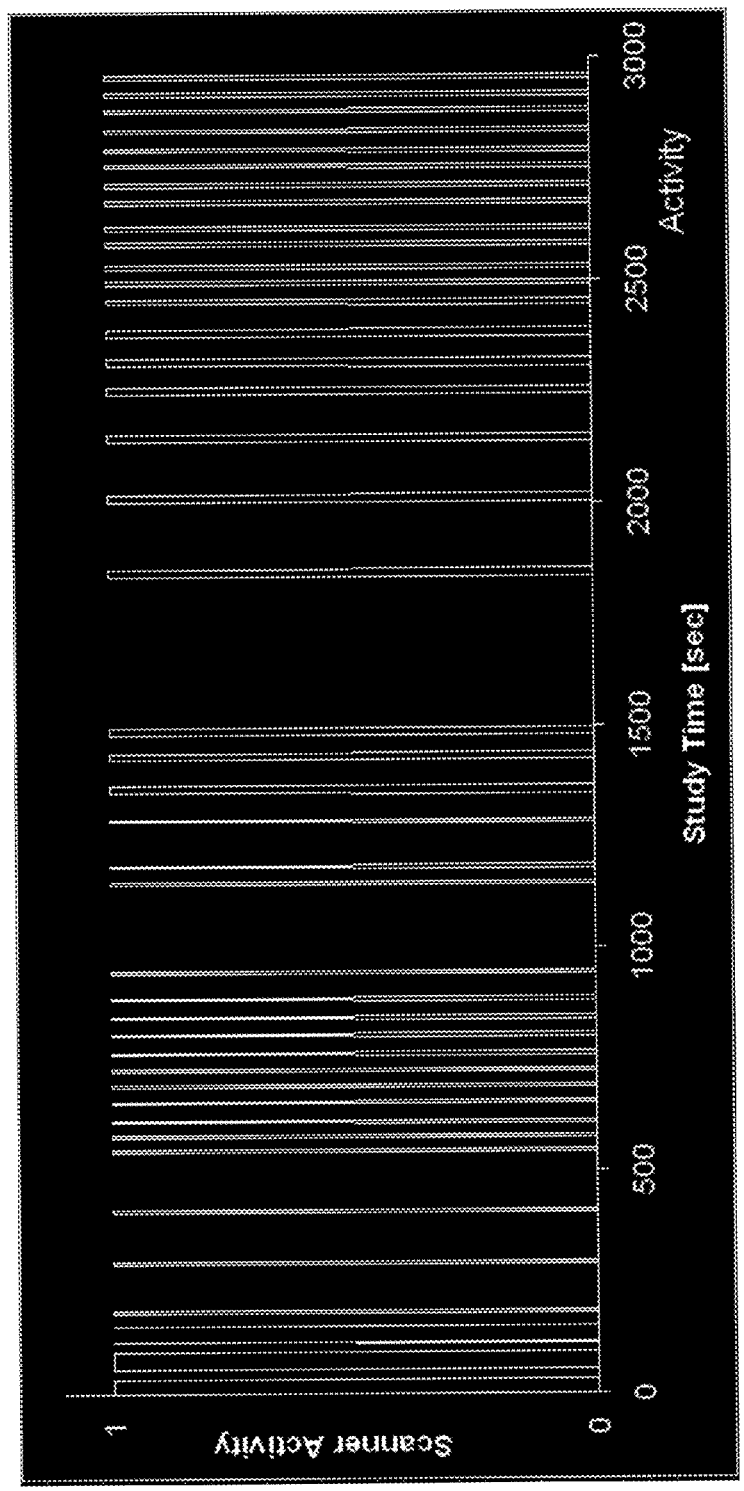
FIG. 1 shows MR scanner activity during a 30 minute acquisition period of a typical cardiac MRI study where the scanner acquires data during approximately 15% of the time period.
Figure 2:
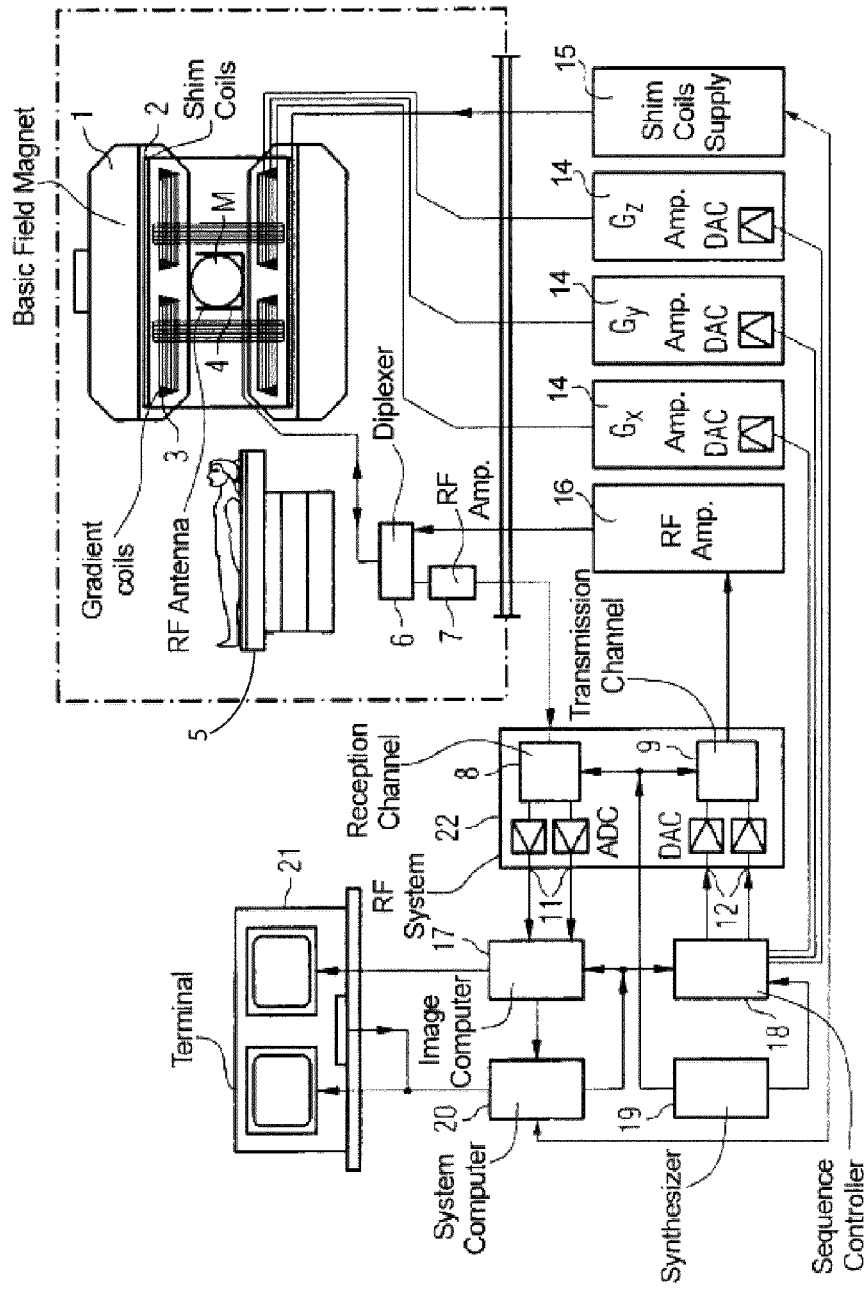
FIG. 2 shows a system for automatically concurrently performing an MR image study acquisition and supplementary image data acquisition, according to invention principles.

FIG. 2 shows system 10 for automatically concurrently performing an MR image study acquisition and supplementary image data acquisition. A basic field magnet 1 generates a strong magnetic field, which is constant in time, for the polarization or alignment of the nuclear spins in the examination region of an object, such as, for example, a part of a human body to be examined on automated movable patient support table 5. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

Imaging computer 17 reconstructs an image from processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

A detector in system computer 20 provides a signal indicating individual portions of an imaging scan using a first imaging method have ceased. An image data processor in imaging computer 17 automatically concurrently interleaves imaging of a first anatomical portion using the first imaging method and supplementary imaging of a second anatomical portion using a different second imaging method, in response to the signal. The image data processor incorporates identifier data in data representing images acquired using the second imaging method. The identifier data identifies images acquired using the second imaging method differently from images acquired using the first imaging method.

Figure 3:
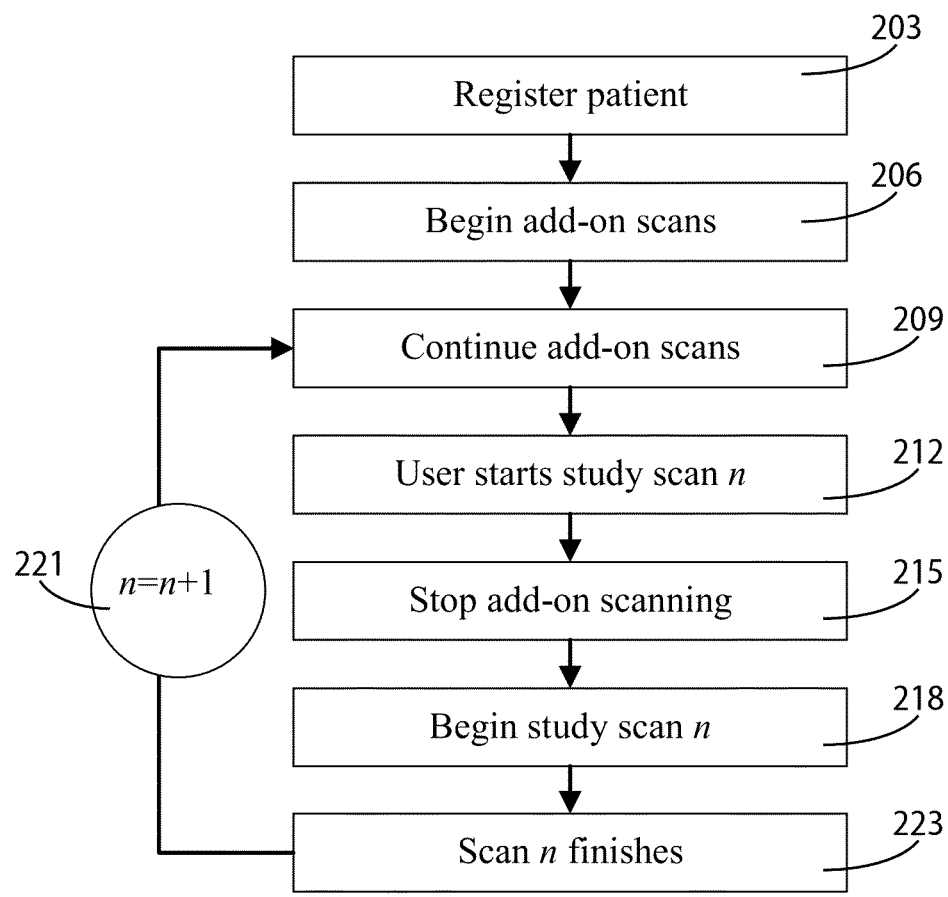
FIG. 3 shows a process for automatically concurrently performing an MR image study acquisition and supplementary image data acquisition, according to invention principles.

FIG. 3 shows a process for automatically concurrently performing an MR image study acquisition and supplementary image data acquisition. A typical MRI study acquires different series of MR images with a desired contrast (e.g. T1-weighted or T2-weighted images) that are subsequently used to identify and diagnose pathology of a specific region of interest or organ (e.g. heart, liver). The imaging protocol (or the series of images to be acquired) is defined by suspected pathology, standard of care and local preferences. Time between consecutive scans is typically used to allow a patient to recover from previous consecutive breath hold scans, preparation of subsequent scans or equipment such as power contrast agent injectors and post-processing of images to define the next steps. The resulting idle time for a cardiac study of the scanner during which no MR images are being acquired, can exceed 80% of the study time.

The idle time is advantageously used to acquire additional (supplementary) MRI images. However, it is desirable that the workflow involved in performing an MRI imaging study is not compromised by acquisition of the additional MRI images. MRI images that are part of a clinically indicated study ("study images") are distinguished herein from additionally acquired MRI images ("add-on" or "supplementary" images).

In step 206 of FIG. 3 system 10 (FIG. 2) initiates performing supplementary image acquisition scans of a patient following the registration of the patient in step 203. The supplementary image acquisition scans are continued in step 209. Acquisition of the supplementary images is optional and is performed with lower priority than study images, i.e. exclusively idle time of the scanner is being used for acquisition of the supplementary images. System 10 acquires the supplementary images automatically without manual user interaction or patient cooperation (such as breath holds, cardiac triggering). The acquisition of supplementary images may be interrupted, stopped and resumed at any time in order to acquire study images. The system pauses, stops and resumes supplementary image acquisition automatically or in another embodiment manually. A request for acquisition of study images triggers pausing and stopping acquisition of supplementary images. Further, the end of acquisition of study images automatically triggers resumption of acquisition of supplementary images.

The overall duration to acquire study images is typically only approximately known and depends on an imaging protocol used. Furthermore, the amount of idle time depends on patient capabilities and cooperation (e.g. required recovery times between breath hold scans), experience of the operator as well as image study protocol. Thus, the available time for add-on images is practically unknown. As a result, requirements for the acquisition of add-on images are advantageously automatically derived using the lookup table of FIG. 4.

Figure 4:
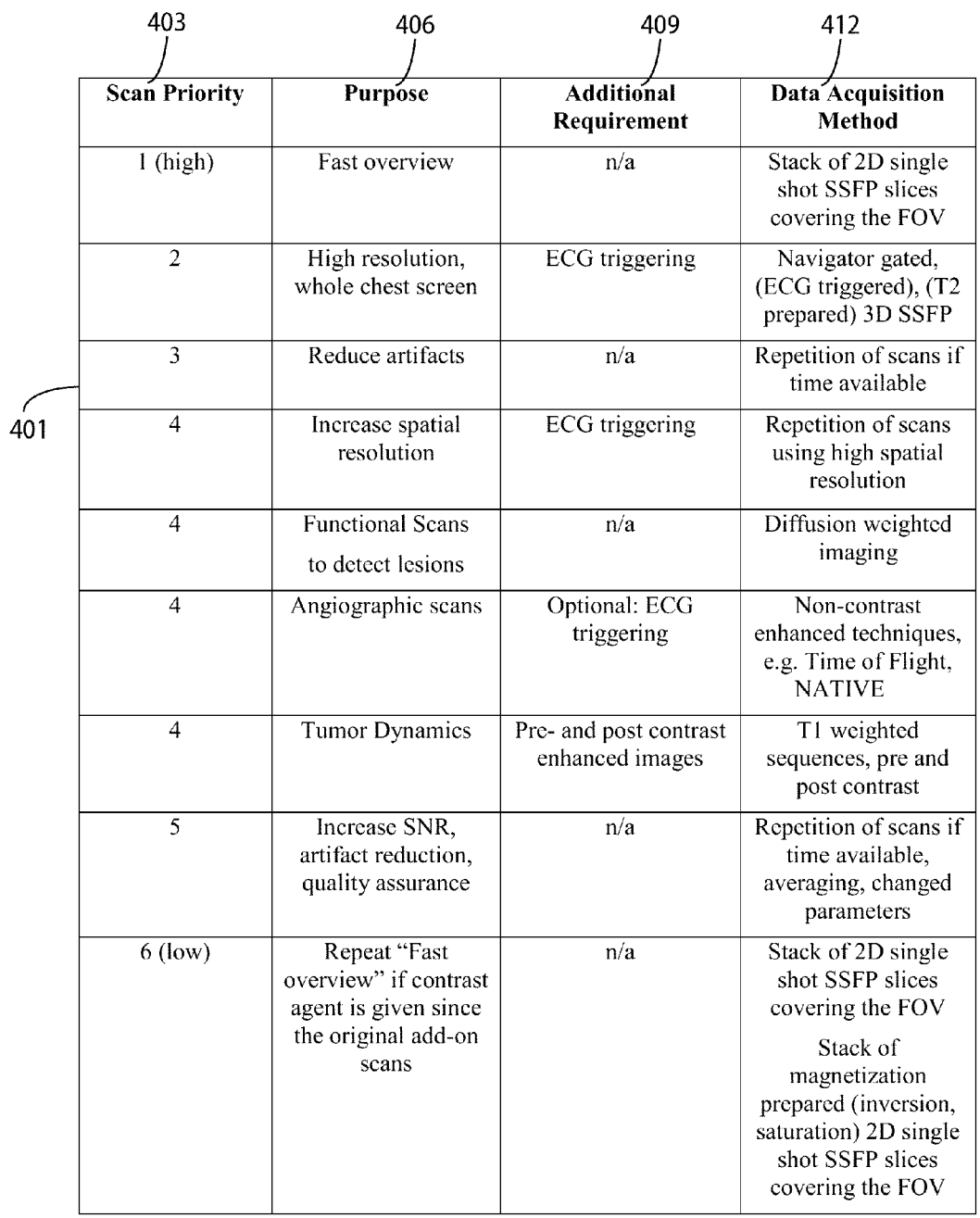
FIG. 4 shows a lookup table associating imaging scan priority for acquiring supplementary images with purpose, imaging requirements and with imaging protocol, according to invention principles.

FIG. 4 shows lookup table 401 associating imaging scan priority (column 403) for acquiring supplementary images with purpose (column 406), imaging requirements (column 409) and with imaging protocol (column 412). System 10 automatically determines an anatomical region for supplementary imaging in response to, available Field-of-View which is dependent on type of imaging scanner, available and active receiver coils and a look up table associating image study regions or anatomical site with anatomical regions for supplementary imaging. Specifically, the look up table associates a heart imaging study with supplementary imaging of lungs, liver, pulmonary vessels and an aorta, and associates a brain imaging study with supplementary imaging of carotid arteries. The look up table further associates a liver imaging study with supplementary imaging of heart, lungs, kidney and pelvic region and associates a pelvic region imaging study with supplementary imaging of liver, kidney and prostate, for example.

The system automatically selects a supplementary imaging protocol in response to a selected priority per the predetermined lookup Table of FIG. 4 stored in repository 17. For instance, for a cardiac study, supplementary images include lungs, liver, pulmonary vessels and an aorta. Priority 1 supplementary imaging in one embodiment, comprises a fast overview imaging acquisition. A stack of T2 slices is acquired using SSFP imaging protocol covering an anatomical region (an SSPF sequence is of particular use to identify incidental findings). Subsequently, to further classify tumors, pre and post contrast images are acquired. Contrast agent may be applied within the scope of the requested imaging study. Pre and post contrast images give valuable information of tumor dynamics (e.g. vascular set up). A typical imaging sequence employed by the system is a T1 weighted (e.g. Volumetric Interpolated Breath hold Examination (VIBE)) protocol. Column 412 of the FIG. 4 Table lists typical imaging protocols that may be used to acquire add on images.

Data comprising supplementary images is acquired in response to scan priority column 403, determined by acquisition speed, spatial coverage, spatial resolution and required image quality, for example. For instance, a derived supplementary scan of a particular priority, may acquire supplementary images across an available field of view (FOV) as fast as possible with compromised spatial resolution or quality. Imaging scan priority (column 403) for acquiring supplementary images is ranked on a scale 1-6 with priority 1 being the highest priority and 6 being the lowest priority. Corresponding purpose (column 406) of a supplementary scan with priority 1 is to acquire supplementary images across an available field of view (FOV) as fast as possible with compromised spatial resolution or quality. The priority 1 supplementary scan acquires a stack of 2D (two dimensional) single shot steady state free precession (SSFP) sequence image slices covering the field of view, for example. A supplementary scan with priority 2 acquires supplementary images of a whole chest area with high resolution using ECG triggering and navigator gated, T2 prepared, 3D (three dimensional) SSFP. A supplementary scan with priority 3 acquires images with increased image quality by eliminating image artifacts (e.g. respiratory motion) and scan repetition if time is available.

A supplementary scan with priority 4 acquires images (e.g. angiography images) with increased spatial and/or temporal resolution, extended spatial coverage and performs a functional scan to detect lesions and tumor dynamics The priority 4 supplementary scans employ different imaging protocols involving scan repetition with high resolution, diffusion weighted imaging, non-contrast enhanced imaging, e.g., Non-contrast MR Angiography, TSE-based NATIVE-SPACE, time of flight and T1 weighted sequences pre and post contrast administration. A supplementary scan with priority 5 acquires images with increased signal-to-noise-ratio (SNR), reduced artifacts and improved quality with scan repetition if time is available using image data averaging and changing imaging settings. A supplementary scan with priority 6 provides a fast overview since contrast agent may have already been administered for a previous scan by acquiring a stack of magnetization prepared 2D (two dimensional) single shot steady state free precession (SSFP) image slices covering the field of view.

Further available idle time may be used to acquire additional data for supplementary images to improve previously acquired data. In an example of an implementation previously acquired low resolution image data may be enhanced with higher resolution data (e.g. by acquiring additional high-resolution data points in a 3D scan), registration of data by estimating motion between scans (e.g. using non-rigid registration) and discarding older data. The process flow involves interleaved add-on and study image acquisition. When the higher priority study scanning is started by an MR operator, the supplementary scans are paused and resumed when the scanner is idle. Therefore, supplementary images are acquired during breaks between image study acquisition.

Figure 5:
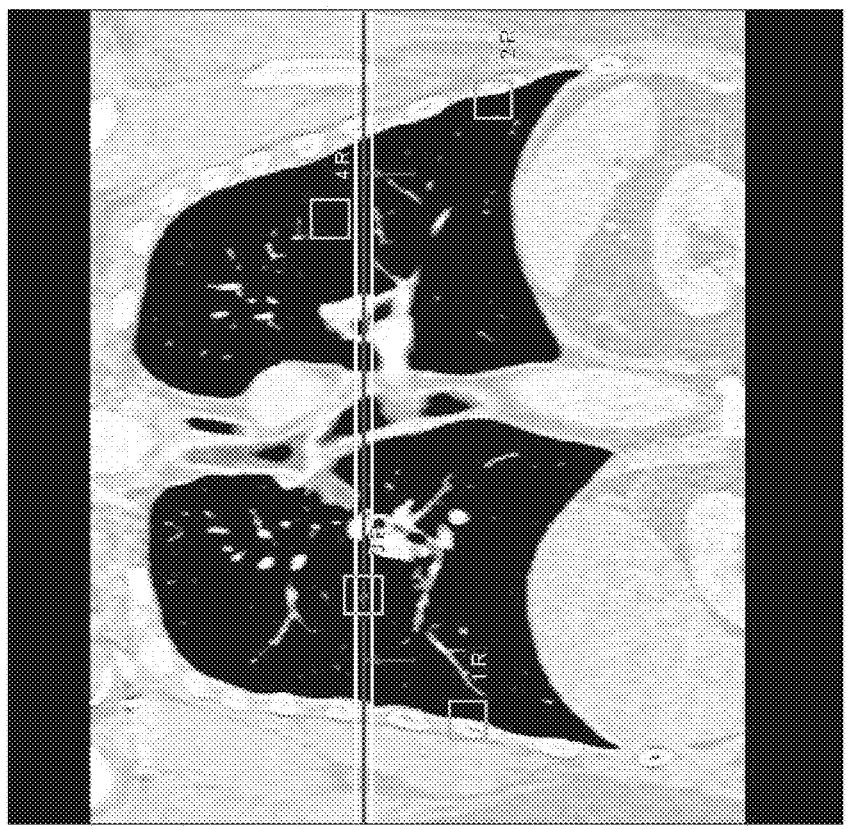
FIG. 5 shows a lung image acquired by supplementary imaging indicating suspicious regions, according to invention principles.

Continuing with the process of FIG. 2, in response to a signal derived from user command, for example, indicating an nth imaging study scan of the patient is to be started, the imaging study scan is initiated in step 212 and the supplementary image acquisition scans are paused in step 215 prior to start of the imaging study. The nth imaging study scan is initiated in step 218 and completed in step 223. The image study scan count is incremented in step 221 to n+1 and the process continues from step 209 where the paused supplementary image acquisition scans are continued. FIG. 5 shows a lung image acquired by supplementary imaging indicating suspicious regions.

System 10 advantageously selects and uses MR protocols particularly useful for incidental findings such as a steady state free precession (SSFP) sequence. This is a high contrast, high SNR, T1/T2 weighted gradient echo sequence. Data acquisition schemes include 2D and 3D imaging, cardiac gating, and single shot as well as use of segmented acquisition. In order to generate and reconstruct images, k-space data is collected commonly using a line-by-line Cartesian sampling pattern. Alternative methods include radial, spiral or echo-planar k-space sampling patterns. Other MRI sequences may include gradient echo (GRE) or spin echo (SE) methods. During idle time occurring within an MRI study acquisition, k-space data is acquired in the most efficient way. Depending on a hierarchy of need (e.g. fast overview, high resolution, elimination of artifacts) and availability of certain data (e.g. electrocardiogram (ECG) data for cardiac triggering) SSFP methods are used.

Although some imaging methods attempt to eliminate or reduce motion artifacts during data acquisition, further post processing may be required in order to obtain acceptable image quality. Acquired supplementary images are analyzed by either a reading physician or by utilizing computer aided diagnostic (CAD) software that can automatically detect suspicious regions and subsequently present them for further evaluation. System 10 in one embodiment detects tumors or aneurism, fatty infiltration or other potentially clinically significant pathological features by detecting image pixel luminance transitions indicative of boundaries of an object such as a tumor and by comparing object shape and size with expected shape and size or by comparison with predetermined template shapes stored in a repository using translation, rotation and scaling functions to match objects, for example. Known available CAD software include Siemens syngo Lung CAD (Siemens Syngo Lung Care product brochure April 2011). An example of an established use of such software is the identification of metastasis using diagnostic images. The supplementary images are advantageously used to automatically identify potential pathology that inexperienced operators or non-specialists are unable to detect.

System 10 sorts both study images and supplementary images into groups. Images are automatically labeled accordingly so that original study images are easily differentiated from supplementary images by a reading physician. Feature detection CAD software is integrated in imaging system 10 so that potential pathology is identified dynamically on the fly and a user is notified during an imaging session of incidental clinical findings. This allows a user to optimize an imaging protocol if necessary in order to further investigate findings from previous supplementary image acquisitions. The system advantageously concurrently interleaves two types of imaging in acquiring diagnostic images that are relevant for a requested imaging scan ("study") and relevant to identify coincidental findings ("add on" findings). The system concurrently interleaves 2 different types of imaging and interleaved performance of a second type of imaging is performed in response to detecting intermittent completion of portions of a first type of imaging.

System 10 automatically determines a time to initiate performing supplementary imaging in response to determination that data acquisition of an imaging study is complete or in response to a specific idle condition of a scanner, e.g. a previous imaging scan is finished and images have been reconstructed and no user interface (e.g. keyboard, mouse) commands and activity are detected indicating an immediate start of a next imaging scan. This may occur for example if a user completes use of an image post processing application, for example. For some imaging studies such as cardiac studies, the time between consecutive supplementary images is estimated based on typical breath hold recovery time of a patient having the age, weight, gender, height characteristics of the patient concerned as a patient needs to recover from a breath hold acquisition between consecutive image scans. The recovery time exceeds a time period being used to acquire study images. The system adapts imaging to patient characteristics and behavior. For instance a simple multiple slice 2D supplementary data acquisition can be aborted or paused and resumed at any time without losing previously acquired 2D slices. Furthermore, 3D data acquisition may be paused and resumed, even if the data may not be well registered due to motion (e.g. patient motion, respiratory motion). Typically, acquired images are compliant with the DICOM standard and system 10 identifies and marks supplementary images with a DICOM Header entry. An example may include officially documented DICOM tags such as "Image Comment", User- Data or so called shadow attributes. Subsequent viewing and post processing executable applications read the appropriate DICOM entries and identify an image as either a supplementary image or an imaging study image, for example, and process the images differently.

Figure 6:
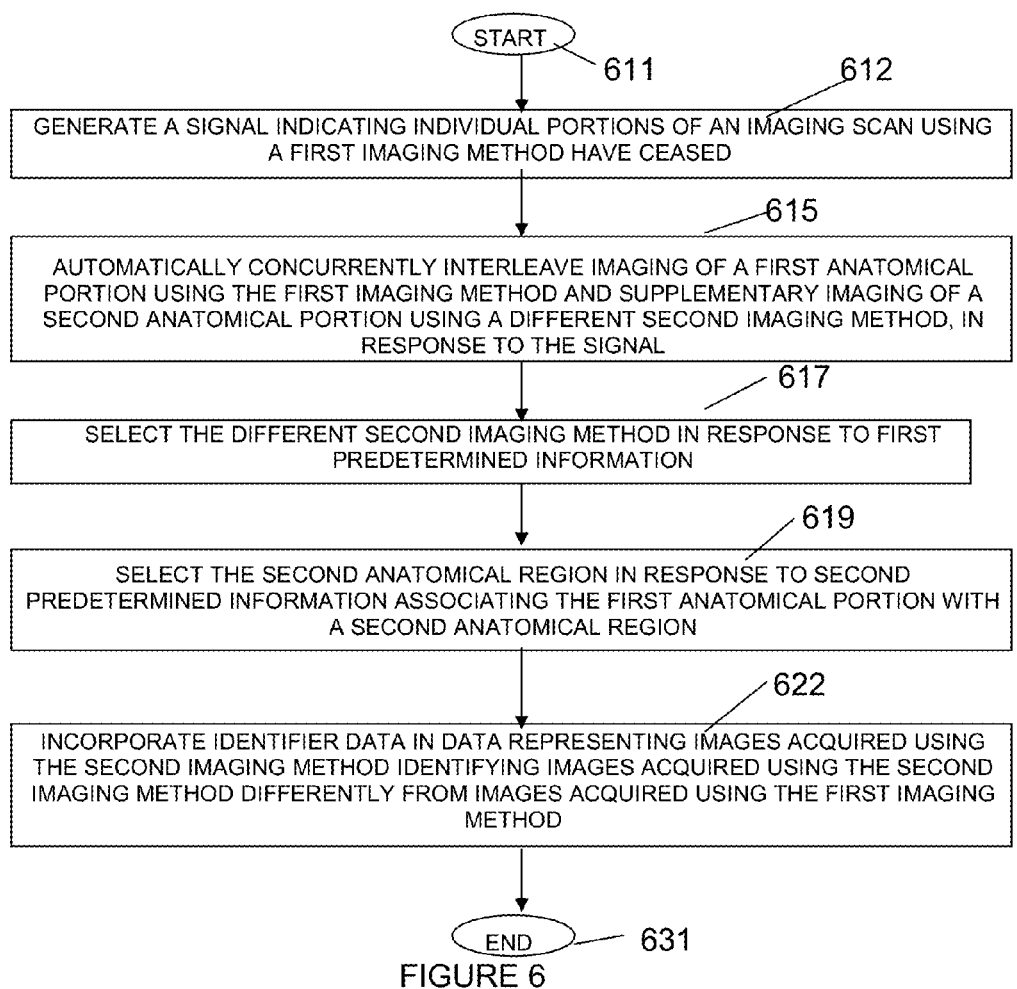
FIG. 6 shows a flowchart of a process performed by a system for automatically concurrently performing an MR image study acquisition and supplementary image data acquisition, according to invention principles.

FIG. 6 shows a flowchart of a process performed by system 10 (FIG. 2) for automatically concurrently performing an MR image study acquisition and supplementary image data acquisition. The supplementary imaging of a second anatomical portion is used to automatically acquire incidental findings. A detector in system computer 20 in step 612 following the start at step 611 provides a signal indicating individual portions of an imaging scan using a first imaging method have ceased. The detector detects individual portions of the imaging scan using the first imaging method have ceased in response to detection of at least one of, (a) user inactivity determined from lack of a user interface command for a time exceeding a predetermined time duration, (b) a user command initiating activation of an image post-processing executable application, (c) an idle condition of an MR scanner using scanner status indicative data and (d) termination of a previous imaging scan and completion of associated image reconstruction.

In step 615, an image data processor in imaging computer 17 automatically concurrently interleaves imaging of a first anatomical portion using the first imaging method and supplementary imaging of a second anatomical portion using a different second imaging method, in response to the signal. In one embodiment the first anatomical portion is substantially the same as the second anatomical portion but in another embodiment, the first anatomical portion is different to the second anatomical portion. The image data processor in step 617 automatically adaptively dynamically selects the different second imaging method in response to first predetermined information and a determination of availability of a heart cycle trigger signal. In step 619 the processor selects the second anatomical region in response to second predetermined information associating the first anatomical portion with a second anatomical region.

The image data processor automatically selects the second anatomical region in response to a scanner specific available field of view, available receiver coils and predetermined information associating the first anatomical portion with a second anatomical region used for acquiring incidental findings. The predetermined information associates a first anatomical portion comprising a heart with a second anatomical region comprising at least one of, (a) lungs, (b) liver, (c) pulmonary vessels and (d) an aorta, associates a first anatomical portion comprising a brain with a second anatomical region comprising Carotid Arteries, associates a first anatomical portion comprising a liver with a second anatomical region comprising at least one of, (a) heart, (b) lungs, (c) kidney and (d) pelvis and associates a first anatomical portion comprising a pelvis with a second anatomical region comprising at least one of, (a) liver, (b) kidney and (c) prostate gland. The image data processor automatically initiates imaging of the second anatomical portion using the different second imaging method, in response to the signal and the image data processor automatically adaptively dynamically selects the different second imaging method in response to predetermined data indicating a hierarchical ranking of imaging sequential priority and associated predetermined imaging methods.

The image data processor in step 622 incorporates identifier data in data (e.g. a DICOM data field) representing images acquired using the second imaging method identifying images acquired using the second imaging method differently from images acquired using the first imaging method.

Further, the image data processor automatically processes supplementary images of the second anatomical portion by sorting supplementary images into groups to identify and classify incidental findings comprising a potential tumor and other abnormalities. The processor initiates generation of an alert message in response to detecting an abnormality. The process of FIG. 6 terminates at step 631.

Returning to FIG. 2, in the basic magnetic field 1, a cylinder-shaped gradient coil system 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times.

Within the gradient field system 3, radio-frequency (RF) coils 4 are located which converts the radio-frequency pulses emitted by a radio-frequency power amplifier 16 via multiplexer 6 into a magnetic alternating field in order to excite the nuclei and align the nuclear spins of the object to be examined or the region of the object to be examined. In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produce magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via an amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M. The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication therebetween. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouth, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 2-6 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. A system uses idle time of a patient scan to automatically acquire supplementary diagnostic images of an anatomical portion that are automatically sorted into groups to identify and classify incidental findings comprising a potential tumor and other abnormalities. Further, the system and processes may, in alternative embodiments, be located on one or more (e.g., distributed) processing devices on a network linking the units of FIG. 2. Any of the functions and steps provided in FIGS. 2-6 may be implemented in hardware, software or a combination of both.

Definitions

A single imaging scan comprises an automated image acquisition process for acquiring a sequence of images using an imaging system that is performed according to predetermined instruction and without human intervention.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted). Adiabatic IR pulses are used to give more uniform contrast throughout an imaging volume than non-adiabatic RF pulses.

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI comprises inversion time, the time between an inversion recovery pulse and the next RF excitation pulse. TI determines the image contrast.

$T_1$ comprises the longitudinal (or spin-lattice) relaxation time $T_1$ decay constant.

$T_2$ comprises the transverse (or spin-spin) relaxation time $T_2$ is the decay constant for a proton spin component.

TR comprises repetition time, the time between successive RF excitation pulses.

TE (Echo Time) comprises a time period between the start of an RF pulse and the maximum in the received echo signal. The sequence is repeated every TR seconds.

A saturation pulse (or saturation recovery pulse) comprises an RF pulse, typically 90 degrees (or any odd multiple of 90 degrees). Some systems use a spoiler gradient after the RF pulse. In a particular type of partial saturation pulse sequence a preceding pulse leaves the spins in a state of saturation, so that recovery at the time of the next pulse has taken place from an initial condition of no magnetization.

What is claimed is:

1. A system for automatically concurrently performing an MR image study acquisition and supplementary image data acquisition, comprising:

a detector configured to provide a signal indicating individual portions of an imaging scan using a first imaging method have ceased; and an image data processor configured to:

concurrently interleave imaging of a first anatomical portion using said first imaging method and supplementary imaging of a second anatomical portion using a second imaging method in response to said signal, and incorporate identifier information in said supplementary image data, wherein said supplementary image data is acquired using said second imaging method, to identify images acquired using said second imaging method differently from images acquired using said first imaging method, wherein said second imaging method is different from said first imaging method.

2. A system according to claim 1, wherein
said first anatomical portion is substantially the same as said second anatomical portion.

3. A system according to claim 1, wherein
said first anatomical portion is different to said second anatomical portion, and
said image data processor is configured to automatically select said second anatomical region based on predetermined information associating said first anatomical portion with a second anatomical region used for acquiring said supplementary image data.

4. A system according to claim 3, wherein
said predetermined information associates a first anatomical portion comprising a heart with a second anatomical region comprising at least one of (a) a lung, (b) a liver, (c) a pulmonary vessel, and (d) an aorta.

5. A system according to claim 3, wherein
said predetermined information associates a first anatomical portion comprising a brain with a second anatomical region comprising cartotid arteries.

6. A system according to claim 3, wherein
said predetermined information associates a first anatomical portion comprising a liver with a second anatomical region comprising at least one of (a) a heart, (b) a lung, (c) a kidney and (d) a pelvis.

7. A system according to claim 3, wherein
said predetermined information associates a first anatomical portion comprising a pelvis with a second anatomical region comprising at least one of (a) a liver, (b) a kidney, and (c) a prostate gland.

8. A system according to claim 1, wherein
said first anatomical portion is different to said second anatomical portion, and
said image data processor is configured to automatically select said second anatomical region based on a scanner specific available field of view.

9. A system according to claim 1, wherein
said first anatomical portion is different to said second anatomical portion, and
said image data processor automatically selects said second anatomical region in response to available receiver coils.

10. A system according to claim 1, wherein
said detector is configured to detect that individual portions of said imaging scan using said first imaging method have ceased based on a detection of an idle condition of an MR scanner from scanner status indicative data.

11. A system according to claim 1, wherein
said detector is configured to detect that individual portions of said imaging scan using said first imaging method have ceased based on a detection of at least one of (a) user inactivity determined from lack of a user interface command for a time exceeding a predetermined time duration, and (b) a user command initiating activation of an image post-processing executable application.

12. A system according to claim 1, wherein
said detector is configured to detect that individual portions of said imaging scan using said first imaging method have ceased based on a detection of a termination of a previous imaging scan and completion of an associated image reconstruction.

13. A system according to claim 1, wherein
said supplementary imaging of said second anatomical portion is used to automatically acquire incidental findings.

14. A system according to claim 13, wherein
said image data processor is configured to automatically process supplementary images of said second anatomical portion to identify said incidental findings,
wherein said incidental findings comprise a potential tumor.

15. A system according to claim 14, wherein
said incidental findings further comprise other abnormalities.

16. A system according to claim 1, wherein
said image data processor is configured to automatically initiate imaging of said second anatomical portion using said second imaging method in response to said signal, and
said image data processor is configured to adaptively dynamically select said second imaging method based on predetermined data indicating a hierarchical ranking of imaging sequence priority and associated predetermined imaging methods.

17. A system according to claim 16, wherein
said image data processor is configured to adaptively dynamically select said second imaging method based on a determination of an availability of a heart cycle trigger signal.

18. A system according to claim 16, wherein
said image data processor incorporates identifier data in a DICOM data field.

19. A system according to claim 1, wherein said image data processor is configured to:
automatically process supplementary images of said second anatomical portion by sorting said supplementary image data into groups, and
initiate generation of an alert message in response to a detection of an abnormality.

20. A system for automatically concurrently performing an MR image study acquisition and supplementary image data acquisition, comprising:
a detector configured to provide a signal indicating individual portions of an imaging scan using a first imaging method have ceased; and
an image data processor configured to:
concurrently interleave imaging of a first anatomical portion using said first imaging method and supplementary imaging of a second anatomical portion using a second imaging method in response to said signal,
select said second imaging method based on a first predetermined information,
select said second anatomical region in response to a second predetermined information associating said first anatomical portion with a second anatomical region; and
incorporate identifier information in said supplementary image data, wherein said supplementary image data is acquired using said second imaging method, to identify images acquired using said second imaging method differently from images acquired using said first imaging method,
wherein said second imaging method is different from said first imaging method.

21. A method for automatically concurrently performing an MR image study acquisition and supplementary image data acquisition, comprising the steps of:

generating a signal indicating that individual portions of an imaging scan using a first imaging method have ceased;

concurrently interleaving imaging of a first anatomical portion using said first imaging method and supplementary imaging of a second anatomical portion using a second imaging method, in response to said signal; and incorporating identifier information in said supplementary image data, wherein said supplementary image data is acquired using said second imaging method, to identify images acquired using said second imaging method differently from images acquired using said first imaging method, wherein said second imaging method is different from said first imaging method.

* * * * *